(12) United States Patent
Yao et al.

(10) Patent No.: US 8,568,958 B2
(45) Date of Patent: Oct. 29, 2013

(54) UNDERLAYER COMPOSITION AND PROCESS THEREOF

(75) Inventors: Huirong Yao, Plainsboro, NJ (US);
Guanyang Lin, Whitehouse Station, NJ (US); Zachary Bogusz, Belmar, NJ (US); PingHung Lu, Bridgewater, NJ (US); WooKyu Kim, Bridgewater, NJ (US); Mark Neisser, Whitehouse Station, NJ (US)

(73) Assignee: AZ Electronic Materials USA Corp., Somerville, NJ (US)

( * ) Notice: Subject to any disclaimer, the term of this patent is extended or adjusted under 35 U.S.C. 154(b) by 181 days.

(21) Appl. No.: 13/164,869

(22) Filed: Jun. 21, 2011

(65) Prior Publication Data

US 2012/0328990 A1 Dec. 27, 2012

(51) Int. Cl.
| G03F 7/20 | (2006.01) |
| G03F 7/00 | (2006.01) |
| C08K 5/04 | (2006.01) |
| C08K 5/00 | (2006.01) |
| H01L 51/00 | (2006.01) |

(52) U.S. Cl.
USPC ........ 430/275.1; 430/330; 430/311; 430/323; 430/326; 430/271.1; 524/381; 438/952

(58) Field of Classification Search
None
See application file for complete search history.

(56) References Cited

U.S. PATENT DOCUMENTS

| 3,474,054 A | 10/1969 | White |
| 4,200,729 A | 4/1980 | Calbo |
| 4,251,665 A | 2/1981 | Calbo |
| 4,491,628 A | 1/1985 | Ito et al. |
| 5,187,019 A | 2/1993 | Calbo et al. |
| 5,350,660 A | 9/1994 | Urano et al. |
| 5,843,624 A | 12/1998 | Houlihan et al. |
| 5,879,859 A * | 3/1999 | Buchwalter et al. ....... 430/280.1 |
| 6,348,299 B1 * | 2/2002 | Aviram et al. ................ 430/322 |
| 6,447,980 B1 | 9/2002 | Rahman et al. |
| 6,723,488 B2 | 4/2004 | Kudo et al. |
| 6,790,587 B1 | 9/2004 | Feiring et al. |
| 6,818,258 B2 | 11/2004 | Kaneko et al. |
| 6,849,377 B2 | 2/2005 | Feiring et al. |
| 6,866,984 B2 | 3/2005 | Jung et al. |
| 6,916,590 B2 | 7/2005 | Kaneko et al. |
| 7,803,458 B2 | 9/2010 | Flaim et al. |
| 2003/0235786 A1 * | 12/2003 | Krishnamurthy et al. . 430/272.1 |

(Continued)

FOREIGN PATENT DOCUMENTS

EP 1 798 599 A1 6/2007

OTHER PUBLICATIONS

"Alkylenes", PAC, 1995, 67, 1307, (Glossary of class names of organic compounds and reactivity intermediates based on structure (IUPAC Recommendations 1995) on p. 13 14, obtained from hhttp://goldbook.iupac.org/!00227-plain.html on Mar. 11, 2013.*

(Continued)

Primary Examiner — Cynthia Hamilton
(74) Attorney, Agent, or Firm — Sangya Jain

(57) ABSTRACT

The present invention relates to an underlayer composition comprising a polymer, an organic titanate compound and optionally a thermal acid generator, where the polymer comprises at least one fluoroalcohol group and at least one epoxy group. The invention also relates to a process for using this underlayer material as an antireflective coating composition and/or a hard mask for pattern transfer.

20 Claims, 3 Drawing Sheets

Examples of Titanate Compound

(56) References Cited

U.S. PATENT DOCUMENTS

2004/0058275 A1* 3/2004 Neef et al. ............... 430/271.1
2008/0076059 A1* 3/2008 Abdallah et al. .......... 430/270.1
2008/0076064 A1* 3/2008 Sun ......................... 430/281.1
2009/0286188 A1 11/2009 Hatakeyama et al.
2010/0028804 A1* 2/2010 Iwato et al. ............... 430/270.1

OTHER PUBLICATIONS

Form PCT/ISA/220, Form PCT/ISA/210, and Form PCT/ISA/237 for PCT/IB2012/001219 dated Oct. 19, 2012, which corresponds to U.S. Appl. No. 13/164,869.

* cited by examiner

Figure 1: Examples of Structure 1
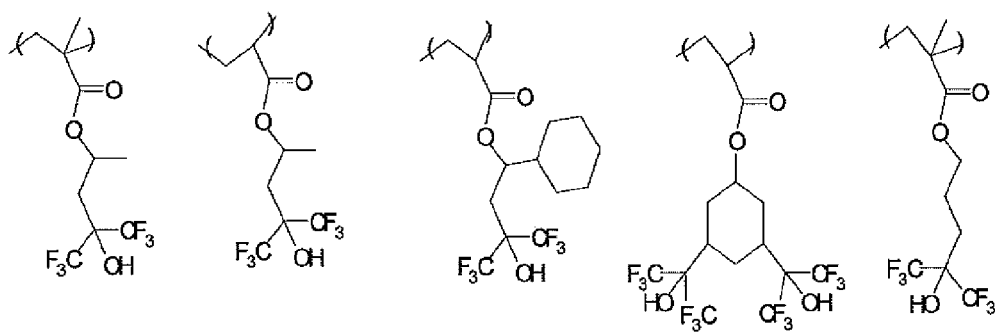

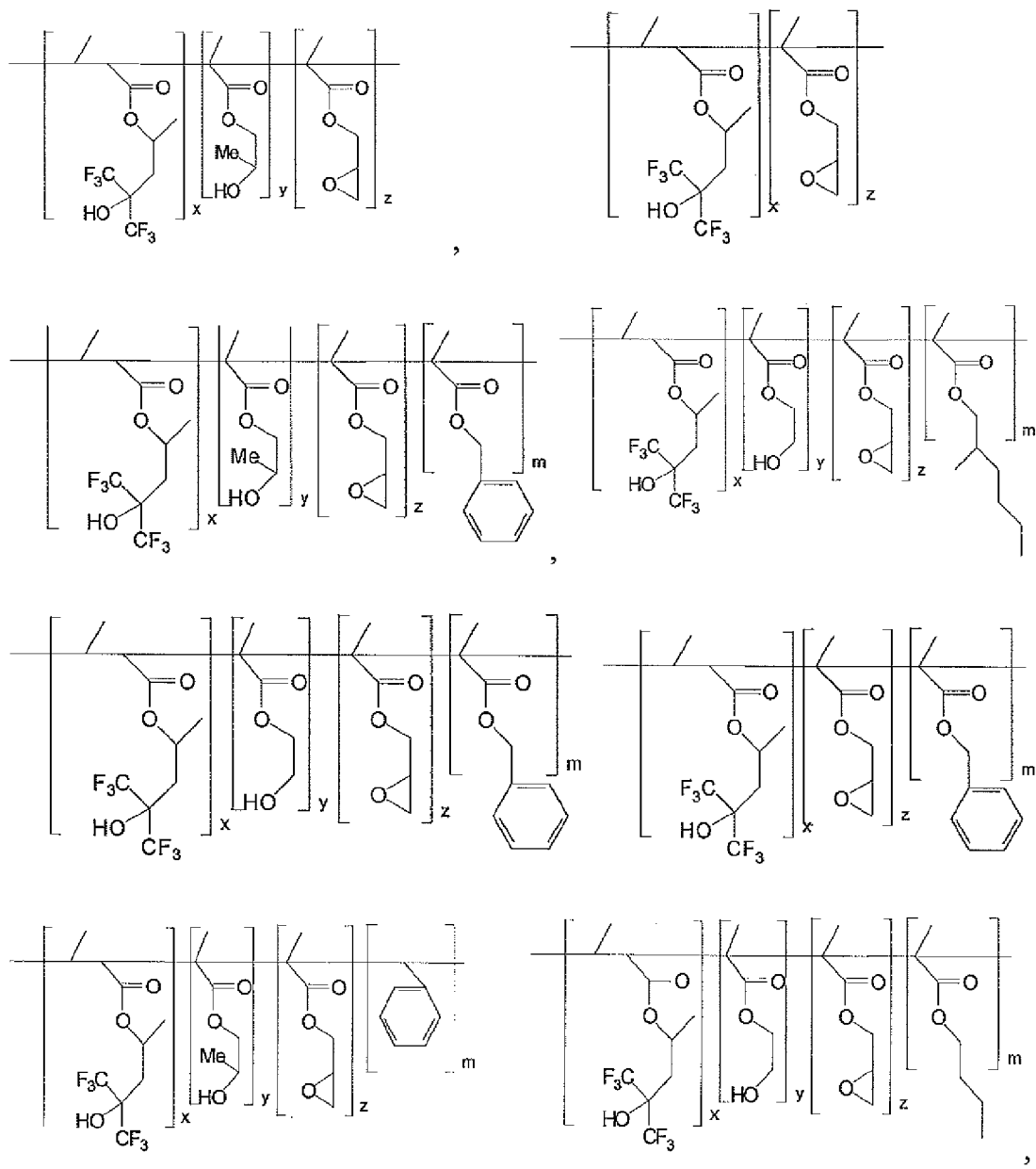
Figure 2: Examples of Organic Polymers

Figure 3: Examples of Titanate Compound
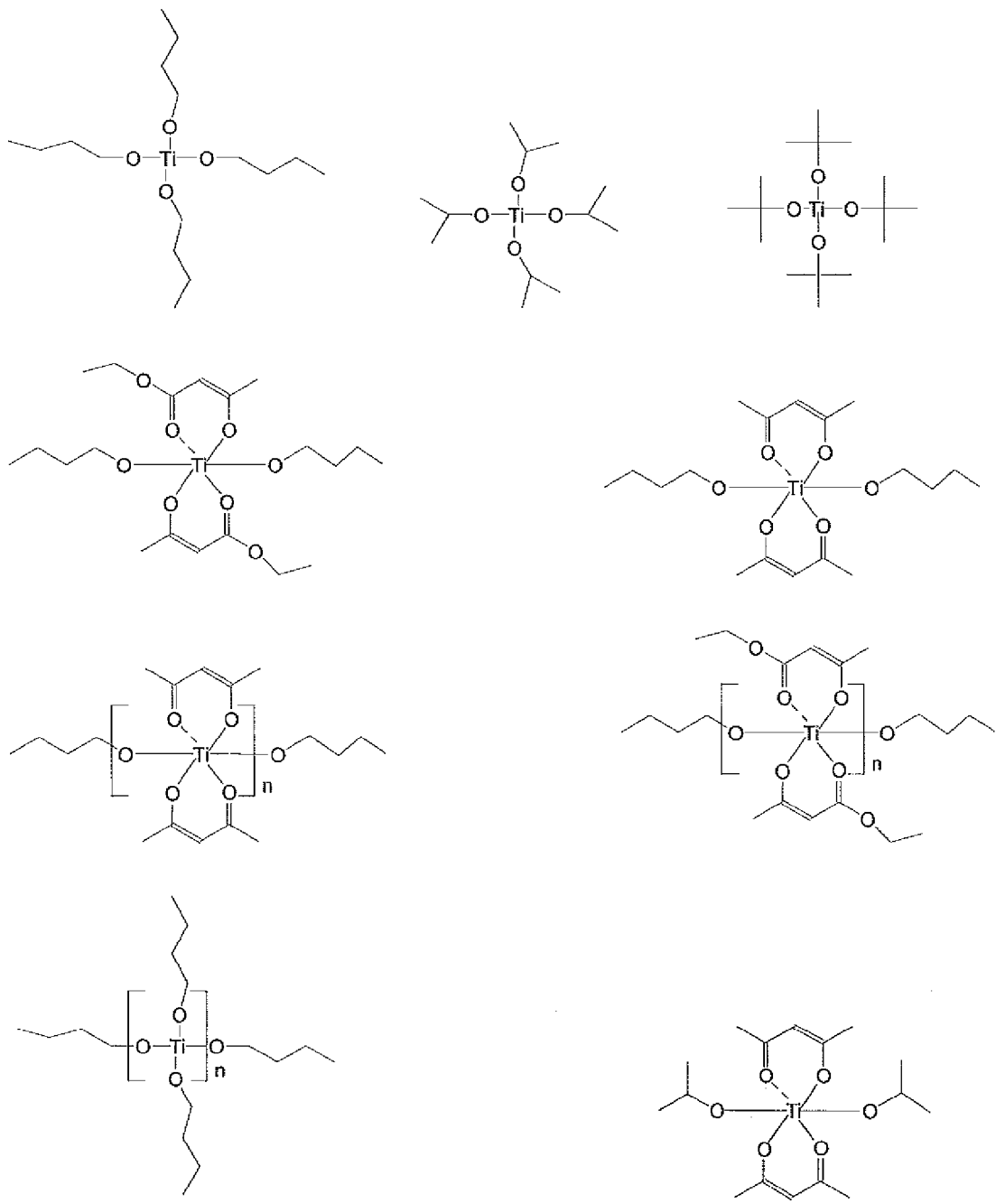

UNDERLAYER COMPOSITION AND PROCESS THEREOF

The present invention relates to compositions of a spin-on metal containing underlayers for photolithographic processes, and a process for imaging using such layers.

Photoresist compositions are used in microlithography processes for making miniaturized electronic components such as in the fabrication of computer chips and integrated circuits. Generally, in these processes, a thin coating of film of a photoresist composition is first applied to a substrate material, such as silicon based wafers used for making integrated circuits. The coated substrate is then baked to evaporate any solvent in the photoresist composition and to fix the coating onto the substrate. The baked coated surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the photoresist.

The trend towards the miniaturization of semiconductor devices has led to the use of new photoresists that are sensitive to shorter and shorter wavelengths of radiation and has also led to the use of sophisticated multilevel systems to overcome difficulties associated with such miniaturization.

Absorbing antireflective coatings and underlayers in photolithography are used to diminish problems that result from back reflection of light from highly reflective substrates. Two major disadvantages of back reflectivity are thin film interference effects and reflective notching. Thin film interference, or standing waves, result in changes in critical line width dimensions caused by variations in the total light intensity in the photoresist film as the thickness of the photoresist changes or interference of reflected and incident exposure radiation can cause standing wave effects that distort the uniformity of the radiation through the thickness. Reflective notching becomes severe as the photoresist is patterned over reflective substrates containing topographical features, which scatter light through the photoresist film, leading to line width variations, and in the extreme case, forming regions with complete photoresist loss. An antireflective coating film coated beneath a photoresist and above a reflective substrate provides significant improvement in lithographic performance of the photoresist. Typically, the bottom antireflective coating is applied on the substrate and then a layer of photoresist is applied on top of the antireflective coating. The antireflective coating is cured to prevent intermixing between the antireflective coating and the photoresist. The photoresist is exposed imagewise and developed. The antireflective coating in the exposed area is then typically dry etched using various etching gases, and the photoresist pattern is thus transferred to the substrate.

Underlayers containing high amount of refractory elements, such as titanium or silicon, can also be used as hard masks after being patterned by an overlying photoresist. Such hard masks are useful when the overlying photoresist is very thin and is not capable of providing high enough dry etch resistance required for transferring the image into the underlying semiconductor substrate. In such circumstances it is useful to coat the photoresist on a coating composed of an inorganic material called a hard mask whose etch resistance is high enough to transfer any patterns created over it into the underlying semiconductor substrate. This is made possible because the organic resist is different than the underlying hard mask and it is possible to find an etch gas mixture which will allow the transfer of the image in the resist into the underlying hard mask. This patterned hard mask can then be used with appropriate etch conditions and gas mixtures to transfer the image from the hard mask into the semiconductor substrate, a task which the resist by itself with a single etch process could not have accomplished. Multiple antireflective layers and underlayers are being used in new lithographic techniques. In cases where the photoresist does not provide sufficient dry etch resistance, underlayers and/or antireflective coatings for the photoresist that act as a hard mask and are highly etch resistant during substrate etching are preferred, and one approach has been to incorporate silicon or titanium into a layer beneath the organic photoresist layer. Additionally, another high carbon content antireflective or mask layer is placed beneath the silicon or titanium antireflective layer, such a trilayer of high carbon film/hardmask film/photoresist is used to improve the lithographic performance of the imaging process. Conventional hard masks can be applied by chemical vapor deposition, sputtering. However, the relative simplicity of spin coating versus the aforementioned conventional approaches makes the development of a new spin-on a hard mask with high concentration of titanium in the film very desirable.

The present invention relates to novel titanium compositions and processes. The novel organic titanate based underlayers have sufficient titanium in the film, depending on the amount of titanium compound present in the composition and the curing process used. The underlayer coating has good resistance to both casting solvent and aqueous alkaline developer over a wide range of both titanium concentration and also optical indices. The coating and crosslinking quality of the underlayer coating is at least comparable to conventional nonmetallic organic bottom antireflective coatings. The novel underlayer compositions also have good stability with long term storage.

The present invention relates to a spin-on coating material useful for generating titanium containing underlayers. The composition has good long term shelf life stability. The film of the novel composition has excellent dry etch resistance and can be used as a hard mask to replace silicon underlayers in many processes, such as trilayer imaging processes. The underlayer coating is capable of absorbing deep ultraviolet radiation and can be used as spin-on inorganic or hybrid antireflective coating to control substrate reflectivity when exposed to deep ultraviolet radiation. The novel composition can also be used as an underlayer in extreme ultraviolet (EUV) lithography to significantly improve photosensitivity, which helps to improve overall EUV photoresist performance. Additionally, the novel composition is capable of forming spin coatable and crosslinked titanium coatings which may be used for many other applications.

SUMMARY OF THE INVENTION

The present invention relates to an underlayer composition comprising a polymer, an organic titanate compound and optionally a thermal acid generator, where the polymer comprises at least one fluoroalcohol group and at least one epoxy group. The invention also relates to a process for using this underlayer material as an antireflective coating composition and/or a hard mask for pattern transfer.

BRIEF DESCRIPTION OF DRAWINGS

FIG. 1 shows examples of units of structure (1).
FIG. 2 shows examples of the polymer.
FIG. 3 shows examples of the organic titanate compound.

DESCRIPTION OF THE INVENTION

The present invention relates to a novel underlayer composition comprising an organic polymer and an organic titanate compound, where the organic polymer comprises at least one fluoroalcohol group and at least one epoxy group. The polymer may comprise at least one unit with a fluoroalcohol group and at least one unit with an epoxy group. The composition may further comprise a thermal acid generator. The polymer can be selfcrosslinkable and free of crosslinker. The invention further relates to a process for forming an image, where the novel composition forms a layer coated under the photoresist film.

The organic polymer of the novel composition, may comprise a unit with a fluoroalcohol group of structure (1), and a unit with an epoxy group of structure (2),

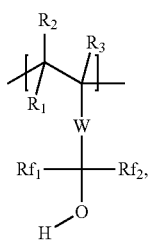

(1)

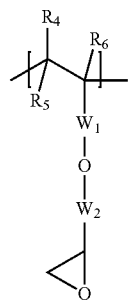

(2)

where, $R_1$ to $R_6$ are independently selected from hydrogen and $C_1$-$C_4$ alkyl, W is a divalent linking group (such as arylene, a carbonyloxy (—C(=O)—O—) and a carbonyloxyalkylene (—C(=O)—O—$W_3$—) where $W_3$ is selected from a $C_1$ to $C_{20}$ alkylene moiety, a fully fluorinated ($C_1$-$C_{20}$) alkylene group and a partially fluorinated ($C_1$-$C_{20}$)alkylene group), $Rf_1$ and $Rf_2$ is independently selected from fully or partially fluorinated ($C_1$-$C_6$) alkyl group; $W_1$ is selected from an arylene linking group, a carbonyl (—(C=O)) linking group, and a carbonyloxyalkylene linking group (—C(=O)—O—$W_4$—) where $W_4$ is selected from a group consisting of $C_1$ to $C_6$ alkylene moiety, fluorinated ($C_1$-$C_6$) alkylene group and partially fluorinated ($C_1$-$C_6$) alkylene group; and $W_2$ a ($C_1$-$C_6$) alkylene moiety. The polymer may contain only monomeric units with structure 1 and structure 2, or may optionally contain other monomeric units. Specific examples of $W_3$ and $W_4$ are independently methylene, ethylene, propylene, isopropylene, and 1-hexylethylene, pentafluoropropylene, 2,2,2-trifluoroethylene and heptafluorobutylene. Specific examples of $Rf_1$ and $Rf_2$ are trifluoromethyl, pentafluoropropyl and 2,2,2-trifluoroethyl, heptafluorobutyl. Specific examples of $W_2$ are methylene, ethylene, propylene, isopropylene. Specific examples of the unit (1) are given in FIG. 1.

The organic polymer may contain units of structure (1) and (2), and may additionally contain the optional recurring unit (3) where $R_7$ to $R_9$ are independently selected from hydrogen and $C_1$-$C_4$ alkyl

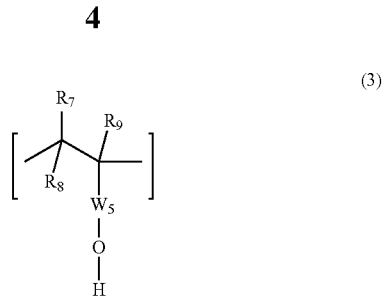

where $W_5$ is selected from a direct valance bond, an arylene group, an ester (C(=O)—O—$R_{14}$) group, a $C_1$-$C_{20}$ alkylene group and mixtures thereof, where $R_{14}$ is selected from $C_1$-$C_{20}$ alkylene, $C_1$-$C_{20}$ alkylenearylene, arylene and substituted arylene. Specific examples of the monomer used to obtain unit (3) are 2-hydroxyethylmethacrylate, 2-hydroxypropylmethacrylate, 2-hydroxybutylmethacrylate and hydroxystyrene.

The underlayer organic polymer may contain units of structure 1 and 2, optionally contain unit of structure (3), and may additionally contain the optional recurring unit (4), where, $R_{10}$ to $R_{12}$ are independently selected from hydrogen, nitrile(CN) and $C_1$-$C_4$ alkyl, $R_{13}$ is an aryl group or an ester (—C(=O)—O—$R_{15}$) group, where $R_{15}$ is selected from a group consisting of a $C_1$-$C_{20}$ alkyl, $C_1$-$C_{20}$ alkylenearyl, aryl, substituted aryl, fluorinated alkyl group, partially fluorinated alkyl group or mixtures thereof. Other monomeric units may also be present in the organic polymer. Specific examples of the monomer used to obtain unit (4) are styrene, benzylmethacrylate, butylmethacrylate, 2-ethylhexyl methacrylate, benzylacrylate and butylacrylate

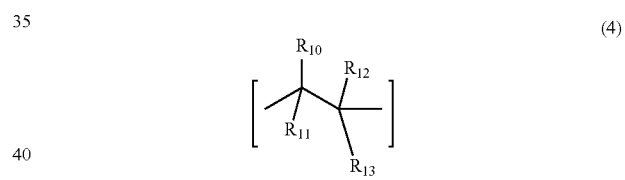

(4)

In the novel underlayer composition the polymer comprises the fluoroalcohol group ranging between 10 and 90 mole % and the epoxy group ranging between 10 and 90 mole %.

In the embodiment of the polymer where only units of structure 1 and 2 are present, unit (1) can range from about 10-80 mole % or 20-60 mole %, while repeat unit (2) can range from about 20-90 mole % or about 30-70 mole %. In the embodiment of the polymer where at least three types of repeat units having structure 1, 2 and 3 or 4 are present, unit 1 can range from about 10-70 mole % or about 20-50 mole %, recurring unit 2 can range from about 10-70 mole % or about 20-50%, and recurring unit 3 or 4 can range from about 1-50 mole % or about 5-40 mole %. In the embodiment of the polymer where at least 4 types of repeat units having structures 1, 2, 3 and 4 are present, unit 1 ranges from 10-70 mole % or 20-50%, repeat unit 2 can range from 10-70 mole % or about 20-50 mole %, repeat unit 3 can range from about 1-40 mole % or about 5-30 mole %, and repeat unit 4 can range from about 1-30 mole % or about 5-25 mole %.

Specific non-limiting examples of organic polymer useful for this invention are shown in FIG. 2, where x, y, z and m are the mole % of the recurring units.

The organic titanate of the novel invention is an organic compound comprising covalently bound titanium. The titanate may be selected from a group consisting of n-alkoxytitanates (5), sec-alkoxytitantes (5), tert-alkoxytitanates (5), titanate esters(5) dialkoxy bis(beta-diketoester) titanates (6), dialkoxy bis(beta-diketone) titanates (7), polymeric alkoxy or ester titanates (8), polymeric titanates based on beta-diketoesters (9) and polymeric titanates based on beta diketones (10), where n=2-10 and $R_{15}$, $R'_{15}$, $R''_{15}$, and $R'''_{15}$ are independently selected from $C_1$-$C_{20}$ alkyl and $C_1$-$C_{20}$ alkyl carbonyl and $R_{16}$ and $R_{17}$ are independently selected from $C_1$-$C_{20}$ alkyl and aryl groups.

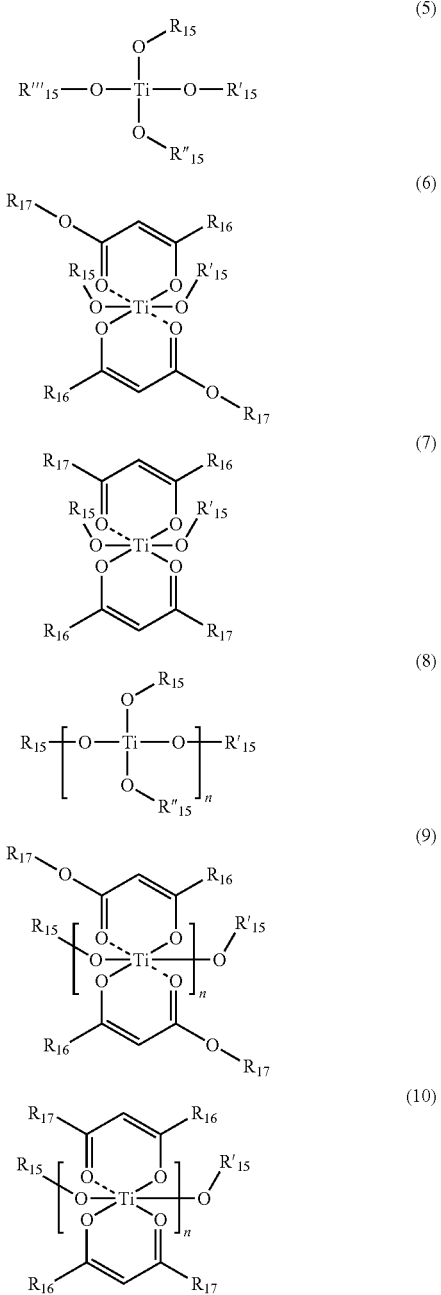

Specific examples of $R_{15}$, $R'_{15}$, $R''_{15}$, and $R'''_{15}$ are ethyl, isopropyl, n-butyl, methylcarbonyl, butylcarbonyl, dodecylcarbonyl, etc. Specific examples of $R_{16}$ and $R_{17}$ are methyl, ethyl, butyl, phenyl, benzyl, trifluoromethyl, etc. Specific examples of n are 6, 7 or 8. Specific non limiting examples of titanate derivatives are shown in FIG. 3, where n=2-10.

Alkyl means linear or branched alkyl having the desirable number of carbon atoms and valence. The alkyl group is generally aliphatic and may be cyclic or acyclic (i.e. noncyclic). Suitable acyclic groups can be methyl, ethyl, n- or isopropyl, n-, iso, or tert-butyl, linear or branched pentyl, hexyl, heptyl, octyl, decyl, dodecyl, tetradecyl and hexadecyl. Unless otherwise stated, alkyl refers to 1-10 carbon atom moieties. The cyclic alkyl groups may be mono cyclic or polycyclic. Suitable example of mono-cyclic alkyl groups include substituted cyclopentyl, cyclohexyl, and cycloheptyl groups. The substituents may be any of the acyclic alkyl groups described herein. Suitable bicyclic alkyl groups include substituted bicyclo[2.2.1]heptane, bicyclo[2.2.2]octane, bicyclo[3.2.1]octane, bicyclo[3.2.2]nonane, and bicyclo[3.3.2]decane, and the like. Examples of tricyclic alkyl groups include tricyclo[5.4.0.0.$^{2,9}$]undecane, tricyclo[4.2.1.2.$^{7,9}$]undecane, tricyclo[5.3.2.0.$^{4}$,9]dodecane, and tricyclo[5.2.1.0.$^{2,6}$]decane. As mentioned herein the cyclic alkyl groups may have any of the acyclic alkyl groups as substituent. Similarly, perfluoroalkyl means an alkyl group as described above in which the hydrogen atoms have been replaced by fluorine. Similarly, a partially fluorinated alkyl group is as described above in which part of the hydrogen atoms have been replaced by fluorine.

Alkylene groups are divalent alkyl groups derived from any of the alkyl groups mentioned hereinabove. When referring to alkylene groups, these include an alkylene chain substituted with ($C_1$-$C_{18}$) alkyl groups in the main carbon chain of the alkylene group. Alkylene groups can also include one or more alkyne groups in the alkylene moiety, where alkyne refers to a triple bond. Essentially an alkylene is a divalent hydrocarbon group as the backbone. Accordingly, a divalent acyclic group may be methylene, 1,1- or 1,2-ethylene, 1,1-, 1,2-, or 1,3 propylene, 2,5-dimethyl-hexene, 2,5-dimethyl-hex-3-yne, and so on. Similarly, a divalent cyclic alkyl group may be 1,2- or 1,3-cyclopentylene, 1,2-, 1,3-, or 1,4-cyclohexylene, and the like. A divalent tricyclo alkyl groups may be any of the tricyclic alkyl groups mentioned herein above. An example of a tricyclic alkyl group is 4,8-bis(methylene)-tricyclo [5.2.1.0.$^{2,6}$]decane. When referring to a perfluoroalkylene these include materials describe above as alkylene group but in which the hydrogen atoms have been replaced by fluorine. Similarly, when describing a partially fluorinated alkylene group this is an alkylene group in which part of the hydrogen atoms have been replaced by fluorine.

Alkoxy means straight or branched chain alkoxy having 1 to 10 carbon atoms, and includes, for example, methoxy, ethoxy, n-propoxy, isopropoxy, n-butoxy, isobutoxy, tert-butoxy, pentyloxy, hexyloxy, heptyloxy, octyloxy, nonanyloxy, decanyloxy, 4-methylhexyloxy, 2-propylheptyloxy, and 2-ethyloctyloxy.

Aryl groups contain 6 to 24 carbon atoms including phenyl, tolyl, xylyl, naphthyl, anthracyl, biphenyls, bis-phenyls, trisphenyls and the like. These aryl groups may further be substituted with any of the appropriate substituents e.g. alkyl, alkoxy, acyl or aryl groups mentioned hereinabove. Similarly, appropriate polyvalent aryl groups as desired may be used in this invention. Representative examples of divalent aryl groups, arylene, include phenylenes, xylylenes, naphthylenes, biphenylenes, and the like.

The term (meth)acrylate refers to methacrylate or acrylate, and similarly, (meth)acrylic refers to methacrylic or acrylic.

The polymers of this invention may be synthesized using any known method of polymerization, such as free-radical polymerization using a catalyst. The polymer may be synthesized using solution, emulsion, bulk, suspension polymerization, or the like. The polymers of this invention are polymerized to give a polymer with a weight average molecular weight from about 1,000 to about 80,000, preferably from about 2,000 to about 40,000. The polydispersity (Mw/Mn) of the free-radical polymers, where Mw is the weight average molecular weight and Mn is the number average molecular weight, can range from 1.0 to 10.0, where the molecular weights of the polymer may be determined by gel permeation chromatography, The polymer of the present novel composition may comprise structure (1) in the range from about 10-90 mole %, structure (2) in the range from about 10-90 mole %, and structure (3) in the range from about 1-50 mole %. Other units when present may be in the range of about 1-40 mole %, or about 1-25 mole %.

The concentration of the organic polymer and the titanate compound, based on total solids can vary depending on the titanium content required in the final underlayer film. The concentration of the titanium in the composition and the curing process can determine the final titanium content of the cured film. The concentration of the organic polymer in the novel composition can vary from about 0.1 weight % to about 90 weight % based on total solids; the concentration of the titanate compound can vary from about 10 weight % to about 99.9 weight % based on total solids. As an example for non-polymeric titanates, the concentration can range from about 10 weight % to about 50 weight % of total solids. For polymeric/oligomeric titanates, the concentration can range from about 10 weight % to about 99.9 weight % of total solids, or 50-97%. Mixtures of the nonpolymeric and polymeric titanates may be also be used.

The titanium content of the cured film can range from about 3-60 weight % or about 5-60 weight % or about 10-50 weight % after a 205° C. cure, as measured by elemental analysis. The curing conditions determine the titanium content of the film, the higher the curing temperature and/or longer the curing time the higher the titanium content.

In the embodiment of the present invention where the underlayer may also act as an antireflective layer, that is, sufficient chromophore groups are present, the refractive indices of the underlayer, n (refractive index) can range from about 1.5 to about 1.9 for the refractive index and k (absorption) can range from about 0.1 to about 0.6 at 193 nm exposure wavelength. The novel film is useful as an antireflective coating at this wavelength and as a hard mask. The n and k values can be calculated using an ellipsometer, such as the J. A. Woollam WVASE VU-32™ Ellipsometer. The exact values of the optimum ranges for k and n are dependent on the exposure wavelength used and the type of application. Typically for 193 nm the preferred range for k is about 0.1 to about 0.6, and for 248 nm the preferred range for k is about 0.15 to about 0.8.

The underlayer coating composition of the present invention may contain 1 weight % to about 50 weight % of the total solids in the solution, or 2 weight % to 30 weight % of the total solids in the solution. The solid components of the underlayer coating composition are mixed with a solvent or mixtures of solvents that dissolve the solid components of the antireflective coating. Suitable solvents for the underlayer coating composition may include, for example, lower alcohols ($C_1$-$C_6$) such as isopropanol, n-butanol, t-butanol, 1-pentanol and 4-methyl-2-pentanol, a glycol such as ethylene glycol and propylene glycol, a glycol ether derivative such as ethyl cellosolve, methyl cellosolve, propylene glycol monomethyl ether, diethylene glycol monomethyl ether, diethylene glycol monoethyl ether, dipropylene glycol dimethyl ether, propylene glycol n-propyl ether, or diethylene glycol dimethyl ether; a glycol ether ester derivative such as ethyl cellosolve acetate, methyl cellosolve acetate, or propylene glycol monomethyl ether acetate; carboxylates such as ethyl acetate, n-butyl acetate and amyl acetate; carboxylates of di-basic acids such as diethyloxylate and diethylmalonate; dicarboxylates of glycols such as ethylene glycol diacetate and propylene glycol diacetate; and hydroxy carboxylates such as methyl lactate, ethyl lactate, ethyl glycolate, and ethyl-3-hydroxy propionate; a ketone ester such as methyl pyruvate or ethyl pyruvate; an alkoxy alcohol such as 2-methoxyethanol, ethoxyethanol, an alkoxycarboxylic acid ester such as methyl 3-methoxypropionate, ethyl 3-ethoxypropionate, ethyl 2-hydroxy-2-methylpropionate, or methylethoxypropionate; a ketone derivative such as methyl ethyl ketone, acetyl acetone, cyclopentanone, cyclohexanone or 2-heptanone; a ketone ether derivative such as diacetone alcohol methyl ether; a ketone alcohol derivative such as acetol or diacetone alcohol; lactones such as butyrolactone and gamma-velaro lactone; an amide derivative such as dimethylacetamide or dimethylformamide, anisole, and mixtures thereof.

The antireflective coating composition comprises the polymer and the titanate compound, and other components may be added to enhance the performance of the coating, e.g. lower alcohols ($C_1$-$C_6$ alcohols), alkoxyalcohols, lactones, $C_1$-$C_{20}$ alkyl carboxylic acids, surface leveling agents (<5 weight % of total solids), dialkoxy bis(betadiketoesters) (1-20 weight % or 5-10 weight % of total solids), dialkoxy bis(beta diketone) (1-20 weight % or 5-10 weight % of total solids), thermal acid generator, photoacid generator, etc. Examples of dialkoxy bis(betadiketoesters) and dialkoxy bis(beta diketone) can be acetylacetone, benzoylacetone, 4,4,4-Trifluoro-1-phenyl-1,3-butanedione, and ethyl acetoacetate Surface leveling agents or surfactants can be polyethylene glycol dodecyl ether, polyoxyethylene oleyl ether, polyethylene glycol octadecyl ether, polyethylene glycol tert-octylphenyl ether, fluorine based surfactant, and silicon based surfactant. Surfactants with the following trade names may be used, Brij30, Brij52, Triton X-100, FC430, etc.

The novel composition comprising the polymer may also comprise an acid generator, and optionally the crosslinker. The acid generator can be a thermal acid generator capable of generating a strong acid upon heating. The thermal acid generator (TAG) used in the present invention may be any one or more that upon heating generates an acid which can react with the polymer and propagate crosslinking of the polymer present in the invention, particularly preferred is a strong acid such as a sulfonic acid. Preferably, the thermal acid generator is activated at above 90° C. and more preferably at above 120° C., and even more preferably at above 150° C. Examples of thermal acid generators are metal-free sulfonium salts and iodonium salts, such as triarylsulfonium, dialkylarylsulfonium, and diarylakylsulfonium salts of strong non-nucleophilic acids, alkylaryliodonium, diaryliodonium salts of strong non-nucleophilic acids; and ammonium, alkylammonium, dialkylammonium, trialkylammonium, tetraalkylammonium salts of strong non nucleophilic acids. Also, covalent thermal acid generators are also envisaged as useful additives for instance 2-nitrobenzyl esters of alkyl or arylsulfonic acids and other esters of sulfonic acid which thermally decompose to give free sulfonic acids. Examples are diaryliodonium perfluoroalkylsulfonates, diaryliodonium tris(fluoroalkylsulfonyl)methide, diaryliodonium bis(fluoroalkylsulfonyl)methide, diaryliodonium bis(fluoroalkylsulfonyl)imide, diaryliodonium or quaternary ammonium perfluoroalkylsulfonate. Examples of labile esters: 2-nitrobenzyl tosylate, 2,4-dinitrobenzyl tosylate, 2,6-dinitrobenzyl tosylate, 4-nitrobenzyl tosylate; benzenesulfonates such as 2-trifluoromethyl-6-nitrobenzyl 4-chlorobenzenesulfonate, 2-trifluoromethyl-6-nitrobenzyl 4-nitro benzenesulfonate; phenolic sulfonate esters such as phenyl, 4-methoxybenzenesulfonate; quaternary ammonium tris(fluoroalkylsulfonyl)methide, and quaternaryalkyl ammonium bis(fluoroalkylsulfonyl)imide, alkyl ammonium salts of organic acids, such as triethylammonium salt of 10-camphorsulfonic acid. A variety of aromatic (anthracene, naphthalene or benzene derivatives) sulfonic acid amine salts can be employed as the TAG, including those disclosed in U.S. Pat. Nos. 3,474,054, 4,200,729, 4,251,665 and 5,187,019. Preferably the TAG will have a very low volatility at temperatures between 170-220° C. Examples of TAGs are those sold by King Industries under Nacure and CDX names. Such TAG's are Nacure 5225, and CDX-2168E, which is a dodecylbenzene sulfonic acid amine salt supplied at 25-30% activity in propylene glycol methyl ether from King Industries, Norwalk, Conn. 06852, USA.

The underlayer coating composition is coated on the substrate using techniques well known to those skilled in the art, such as dipping, spin coating or spraying. The film thickness of the underlayer coating ranges from about 5 nm to about 400 nm, preferably about 10 nm to about 120 nm. The coating is further heated on a hot plate or convection oven for a sufficient length of time to remove any residual solvent and induce curing, and thus insolubilizing the antireflective coating to prevent intermixing between the antireflective coating and the layer to be coated above it. The preferred range of temperature is from about 90° C. to about 300° C., or about 160° C. to about 250° C. The present underlayer coating may be coated over other layer or layers of antireflective coating(s), such as a high carbon (greater than 80% or 85% or 90%) content antireflective coating.

The substrates over which the underlayer coating is formed can be any of those typically used in the semiconductor industry. Suitable substrates include, without limitation, low dielectric constant materials, silicon, silicon substrate coated with a metal surface, copper coated silicon wafer, copper, aluminum, polymeric resins, silicon dioxide, metals, doped silicon dioxide, silicon nitride, tantalum, polysilicon, ceramics, aluminum/copper mixtures; gallium arsenide and other such Group III/V compounds. The substrate may also be other antireflective coatings or underlayers, such as high carbon underlayers coated over the above mentioned substrates. The substrate may comprise any number of layers made from the materials described above.

A film of photoresist is coated on top of the underlayer coating and baked to substantially remove the photoresist solvent. An edge bead remover may be applied after the coating steps to clean the edges of the substrate using processes well known in the art.

Photoresists can be any of the types used in the semiconductor industry, provided the photoactive compound in the photoresist and the antireflective coating substantially absorb at the exposure wavelength used for the imaging process. Photoresists useful for immersion lithography are preferred. Typically, photoresists suitable for imaging with immersion lithography may be used, where such photoresists have a refractive index higher than 1.85 and also are hydrophobic having water contact angle in the range of 75° to 95°.

To date, there are several major deep ultraviolet (uv) exposure technologies that have provided significant advancement in miniaturization, and these radiation of 248 nm, 193 nm, 157 nm and 13.5 nm. Chemically amplified photoresist are often used. Photoresists for 248 nm have typically been based on substituted polyhydroxystyrene and its copolymers/onium salts, such as those described in U.S. Pat. No. 4,491,628 and U.S. Pat. No. 5,350,660. On the other hand, photoresists for exposure at 193 nm and 157 nm require non-aromatic polymers since aromatics are opaque at this wavelength. U.S. Pat. No. 5,843,624 and U.S. Pat. No. 6,866,984 disclose photoresists useful for 193 nm exposure. Generally, polymers containing alicyclic hydrocarbons are used for photoresists for exposure below 200 nm. Alicyclic hydrocarbons are incorporated into the polymer for many reasons, primarily since they have relatively high carbon to hydrogen ratios which improve etch resistance, they also provide transparency at low wavelengths and they have relatively high glass transition temperatures. U.S. Pat. No. 5,843,624 discloses polymers for photoresist that are obtained by free radical polymerization of maleic anhydride and unsaturated cyclic monomers. Any of the known types of 193 nm photoresists may be used, such as those described in U.S. Pat. No. 6,447,980 and U.S. Pat. No. 6,723,488, and incorporated herein by reference. Two basic classes of photoresists sensitive at 157 nm, and based on fluorinated polymers with pendant fluoroalcohol groups, are known to be substantially transparent at that wavelength. One class of 157 nm fluoroalcohol photoresists is derived from polymers containing groups such as fluorinated-norbornenes, and are homopolymerized or copolymerized with other transparent monomers such as tetrafluoroethylene (U.S. Pat. No. 6,790,587, and U.S. Pat. No. 6,849,377) using either metal catalyzed or radical polymerization. Generally, these materials give higher absorbencies but have good plasma etch resistance due to their high alicyclic content. More recently, a class of 157 nm fluoroalcohol polymers was described in which the polymer backbone is derived from the cyclopolymerization of an asymmetrical diene such as 1,1,2,3,3-pentafluoro-4-trifluoromethyl-4-hydroxy-1,6-heptadiene (U.S. Pat. No. 6,818,258) or copolymerization of a fluorodiene with an olefin (U.S. Pat. No. 6,916,590). These materials give acceptable absorbance at 157 nm, but due to their lower alicyclic content as compared to the fluoro-norbornene polymer, have lower plasma etch resistance. These two classes of polymers can often be blended to provide a balance between the high etch resistance of the first polymer type and the high transparency at 157 nm of the second polymer type. Photoresists that absorb extreme ultraviolet radiation (EUV) of 13.5 nm are also useful and are known in the art. Thus photoresists absorbing in the range of about 12 nm to about 250 nm are useful. The novel coatings can also be used in process with nanoimprinting and e-beam resists.

After the coating process, the photoresist is imagewise exposed. The exposure may be done using typical exposure equipment. The exposed photoresist is then developed in an aqueous developer to remove the treated photoresist. The developer is preferably an aqueous alkaline solution comprising, for example, tetramethylammonium hydroxide (TMAH), typically 2.38 weight % TMAH. The developer may further comprise surfactant(s). An optional heating step can be incorporated into the process prior to development and after exposure.

The process of coating and imaging photoresists is well known to those skilled in the art and is optimized for the specific type of photoresist used. The photoresist patterned substrate can then be dry etched with an etching gas or mixture of gases, in a suitable etch chamber to remove the exposed portions of the underlayers and optional other antireflective coatings. Various etching gases are known in the art for etching underlayer coatings, such as those comprising $O_2$, $CF_4$, $CHF_3$, $Cl_2$, HBr, $SO_2$, CO, etc. In one embodiment, the article comprises a semiconductor substrate with a high carbon antireflective film, over which the novel titanium underlayer is coated. A photoresist layer is coated above this. The photoresist is imaged as disclosed above and the titanium underlayer is dry etched using gases comprising fluorocarbons. After the titanium underlayer is etched, the high carbon film can be dry etched using oxygen or oxygen mixtures.

Each of the documents referred to above are incorporated herein by reference in its entirety, for all purposes. The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLES

The refractive index (n) and the absorption (k) values of the antireflective coating in the Examples below were measured on a J. A. Woollam VASE32 ellipsometer.

The molecular weight of the polymers was measured on a Gel Permeation Chromatograph.

Synthesis Example 12.9 g of isopropyl hexafluoroisopropanol methacrylate (MA-BTHB-OH), 7.7 g of benzyl methacrylate, 6.8 g of 2-hydroxyethyl methacrylate and 8.5 g of glycidyl methacrylate, were mixed with 160 g of propyleneglycol monomethyl ether (PGME) solvent. The polymerization reaction took place in the presence of 1.5 g of azobisisobutyronitrile (AIBN) at 75° C. under nitrogen for 6 hours. After cooling down to room temperature, the reaction mixture was precipitated in deionized (DI) water. The white polymer solid was washed and dried under vacuum at 45° C. with a yield of 35.5 g (99%). The weight average molecular weight measured by GPC ($M_w$) was 18,000.

Synthesis Example 2

9.7 g of MA-BTHB-OH, 5.8 g of benzyl methacrylate, 5.1 g of 2-hydroxyethyl methacrylate and 6.4 g of glycidyl methacrylate, were mixed with in 120 g of tetrahydrofuran (THF) solvent. The polymerization reaction took place in the presence of 1.0 g of AIBN at 75° C. under nitrogen for 20 hrs. After cooling down to room temperature, the reaction mixture was precipitated in DI water. The white polymer solid was washed and dried under vacuum at 45° C. with a yield of 26.5 g (99%) The $M_w$ of polymer measured by GPC was 19,000.

Synthesis Example 3

15.0 g of MA-BTHB-OH, 6.0 g of styrene, 10.0 g of 2-hydroxypropyl methacrylate and 19.0 g of glycidyl methacrylate, were mixed in 200 g of propylene glycol monomethyl ether acetate (PGMEA) solvent. The polymerization reaction took place in the presence of 0.97 g of AIBN at 75° C. under nitrogen for 24 h. After cooling down to room temperature, the reaction mixture was precipitated in DI water. The white polymer solid was washed and dried under vacuum at 45° C. with a yield of 50.0 g (>99%). The $M_w$ of polymer measured by GPC was 18,500.

Synthesis Example 4

9.7 g of MA-BTHB-OH, 5.8 g of benzyl methacrylate, and 11.9 g of glycidyl methacrylate, were mixed in 120 g of THF solvent. The polymerization reaction took place in the presence of 1.0 g of AIBN at 75° C. under nitrogen for 20 hrs.

After cooling down to room temperature, the reaction mixture was precipitated in DI water. The white polymer solid was washed and dried under vacuum at 45° C. with a yield of 27.0 g (99%).

Synthesis Example 5

9.7 g of MA-BTHB-OH, 5.3 g of benzyl methacrylate, 6.5 g of 2-hydroxypropyl methacrylate and 6.4 g of glycidyl methacrylate, were mixed in 120 g of THF solvent. The polymerization reaction took place in the presence of 1.0 g of AIBN at 75° C. under nitrogen for 20 hrs. After cooling down to room temperature, the reaction mixture was precipitated in DI water. The white polymer solid was washed and dried under vacuum at 45° C. with a yield of 27 g (99%).

Synthesis Example 6

9.7 g of MA-BTHB-OH, 5.9 g of 2-ethylhexyl methacrylate, 3.5 g of 2-hydroxyethyl methacrylate and 8.5 g of glycidyl methacrylate, were mixed in 120 g of THF solvent. The polymerization reaction took place in the presence of 1.0 g of AIBN at 75° C. under nitrogen for 20 hrs. After cooling down to room temperature, the reaction mixture was precipitated in DI water. The white polymer solid was washed and dried under vacuum at 45° C. with a yield of 27.2 g (99%). The Mw of the polymer measured by GPC was 19,100.

Synthesis Example 7

13.2 g of MA-BTHB-OH, 5.9 g of 2-ethylhexyl methacrylate, 2.9 g of 2-hydroxyethyl methacrylate and 7.4 g of glycidyl methacrylate, were mixed in 120 g of THF solvent. The polymerization reaction was allowed in the presence of 1.0 g of AIBN at 75° C. under nitrogen for 20 hrs. After cooling down to room temperature, the reaction mixture was precipitated in DI water. The white polymer solid was washed and dried under vacuum at 45° C. with a yield of 29 g (99%). The Mw of the polymer measured by GPC was 19,300.

Synthesis Example 8

18.5 g of MA-BTHB-OH and 12.3 g of glycidyl, methacrylate, were mixed in 120 g of THF solvent. The polymerization reaction took place in the presence of 1.0 g of AIBN at 75° C. under nitrogen for 20 h. After cooling down to room temperature, the reaction mixture was precipitated in DI water. The white polymer solid was washed and dried under vacuum at 45° C. with a yield of 30.2 g (99%).

Synthesis Example 9

18.5 g of MA-BTHB-OH, 3.5 g of 2-hydroxyethyl methacrylate and 8.5 g of glycidyl methacrylate, were mixed in 120 g of THF solvent. The polymerization reaction was allowed in the presence of 1.0 g of AIBN at 75° C. under nitrogen for 20 hrs. After cooling down to room temperature, the reaction mixture was precipitated in DI water. The white polymer solid was washed and dried under vacuum at 45° C. with a yield of 29.8 g (99%).

Comparative Synthesis Example 1

10 g of butanetetracarboxylic acid dianhydride, 7 g of styrene glycol, 0.5 g of benzyltributylammonium chloride, and 35 g of propyleneglycol monomethyletheracetate (PGMEA) were charged into a flask with a condenser, thermal controller and a mechanical stirrer. Under nitrogen and stirring, the mixture was heated to 110° C. A clear solution was obtained after ~1-2 hr. The temperature was kept at 110° C. for 3 hrs. Upon cooling, 60 g of PGMEA and 36 g of propylene oxide were mixed with the above solution. The reaction was kept at 50° C. for 48 hrs. The reaction solution was cooled to room temperature and slowly poured into a large amount of water in a high speed blender. The polymer was collected and washed thoroughly with water. Finally the polymer was dried in a vacuum oven. 16 g of polymer was obtained with $M_w$ measured by GPC of 20,000.

Formulation Examples

The titanium (IV) butoxide polymer. (TiBTP) liquid from Aldrich Co. (Milwaukee, Wis.) was poured into bottle and the appropriate solvent was added immediately to make a 10-20% stock solution. The solution was mixed well on a roller at room temperature for 5-7 days. To reduce the mixing time from several days to 24 h, the above solution can be prepared at an elevated temperature of 40-50° C. 10% solution of polymers from synthesis examples 1-8 and comparative synthesis example were made in the appropriate solvent. The formulation was prepared by mixing the TiBTP stock solution and one of the polymer stock solutions in proper ratios to obtain the desired TiBTP content in solutions, usually ranging from 30 to 100%. The solution was mixed well for 1-2 days. The above solution can be diluted to achieve the required film thickness. To stabilize and/or improve formulation stability and coating quality, additives such as surfactant, co-solvents (such as lactone, carboxylic acid, and alcohol), and chelating agents such as acetylacetone can be added during dilution. For example, to add 0.2% surfactant and make a final 8% solid content sample, a 1% surfactant stock solution in ArF thinner (PGMEA/PGME 70:30) was prepared. 8 g of 10% TiBTP stock solution was then mixed with 2 g of 1% surfactant stock solution. (Alternatively, the additives can also be added during TiBTP stock solution preparation. For example, a 10% TiBTP solution in PGMEA/PGME 70:30 with 2% GVL can be made as sock solution for underlayer formulations.) Finally, the mixture was filtered through a micro filter with a pore size of 0.2 um and stored for use. Alternatively, the formulation can be prepared at elevated temperatures as described in Formulation and Coating Example 19.

Formulation and Coating Example 1

10 g of Polymer TiBTP liquid from Aldrich was poured into a bottle. 40 g of solvent PGMEA/PGME 70:30 and 1 g of gammavalerolactone (GVL) was added immediately to make a 20% stock solution. After mixing overnight on a roller, the bottle was stored in oven at 40 C for 24 h. The stock solution was continuously mixed on a roller at room temperature for two days. 4 g of above solution, 6 g of PGMEA/PGME 70:30 and 0.1 g of GVL was added in a bottle and mixed for 1-2 days. The mixture then was filtered through a micro filter with a pore size of 0.2 um. The solution was then spun coated on a silicon wafer for 40 seconds. The coated wafer was then heated on a hot plate for 1 minute at 200° C. The underlayer coating was analyzed on a spectroscopic ellipsometer. The optimized refractive index "n" at 193 nm was 1.53 and the absorption parameter "k" was 0.54.

Formulation and Coating Example 2

10 g of Polymer TiBTP liquid from Aldrich was poured into a bottle. 90 g of solvent PGMEA/PGME 70:30 and 1 g of acetylacetone were added immediately to make a 10% stock solution. The stock solution was mixed on a roller at room temperature for several days. The mixture then was filtered through a micro filter with a pore size of 0.2 um. The solution was then spun coated on a silicon wafer for 40 seconds. The coated wafer was then heated on a hot plate for 1 minute at 200° C.

Formulation and Coating Example 3

10 g of Polymer TiBTP liquid from Aldrich was poured into a bottle. 90 g of solvent PGMEA/PGME 70:30 was added immediately and mixed on a roller for 5-7 days to make a 10% stock solution. 1 g of polymer from synthesis example 2 and 9 g of PGMEA/PGME 70:30 were mixed to make a 10% polymer stock solution. 9.5 g of TiBTP stock solution was mixed with 0.5 g of polymer stock solution. 2.5 g of PGMEA/PGME 70:30 and 0.25 g of GVL was added in the above mixture. The solution was mixed on a roller for 1-2 days. The mixture then was filtered through a micro filter with a pore size of 0.2 um. The solution was then spun coated on a silicon wafer for 40 seconds. The coated wafer was then heated on a hot plate for 1 minute at 200° C. The underlayer coating was analyzed on a spectroscopic ellipsometer. The optimized refractive index "n" at 193 nm was 1.59 and the absorption parameter "k" was 0.51.

Formulation and Coating Example 4

10 g of Polymer TiBTP liquid from Aldrich was poured into a bottle. 90 g of solvent PGMEA/PGME 70:30 was added immediately and mixed on a roller for 5-7 days to make a 10% stock solution. 1 g of polymer from synthesis example 5 and 9 g of PGMEA/PGME 70:30 were mixed to make a 10% polymer stock solution. 9 g of TiBTP stock solution was mixed with 1 g of polymer stock solution. 0.2 g of GVL was added in above mixture. The solution was mixed on a roller for 1-2 days. The mixture then was filtered through a micro filter with a pore size of 0.2 um. The solution was then spun coated on a silicon wafer for 40 seconds. The coated wafer was then heated on a hot plate for 1 minute at 200° C. The underlayer coating was analyzed on a spectroscopic ellipsometer. The optimized refractive index "n" at 193 nm was 1.63 and the absorption parameter "k" was 0.48.

Formulation and Coating Example 5

10 g of Polymer TiBTP liquid from Aldrich was poured into a bottle. 90 g of solvent PGMEA/PGME 70:30 was added immediately and mixed on a roller for 5-7 days to make a 10% stock solution. 1 g of polymer from synthesis example 6 and 9 g of PGMEA/PGME 70:30 were mixed to make a 10% polymer stock solution. 9 g of TiBTP stock solution was mixed with 1 g of polymer stock solution. 2.5 g of 2-methoxyethanol and 0.25 g of GVL was added in above mixture. The solution was mixed on a roller for 1-2 days. The mixture then was filtered through a micro filter with a pore size of 0.2 um. The solution was then spun coated on a silicon wafer for 40 seconds. The coated wafer was then heated on a hot plate for 1 minute at 200° C. The underlayer coating was analyzed on a spectroscopic ellipsometer. The optimized refractive index "n" at 193 nm was 1.60 and the absorption parameter "k" was 0.47.

Formulation and Coating Example 6

10 g of Polymer TiBTP liquid from Aldrich was poured into a bottle. 90 g of solvent PGMEA/PGME 70:30 was added immediately and mixed on a roller for 5-7 days to make a 10% stock solution. 1 g of polymer from synthesis example 2 and 9 g of PGMEA/PGME 70:30 were mixed to make a 10% polymer stock solution. 7.5 g of TiBTP stock solution was mixed with 2.5 g of polymer stock solution. 6 g of PGMEA/PGME 70:30 and 0.3 g of GVL was added in above mixture. The solution was mixed on a roller for 1-2 days. The mixture then was filtered through a micro filter with a pore size of 0.2 um. The solution was then spun coated on a silicon wafer for 40 seconds. The coated wafer was then heated on a hot plate for 1 minute at 200° C. The underlayer coating was analyzed on a spectroscopic ellipsometer. The optimized refractive index "n" at 193 nm was 1.74 and the absorption parameter "k" was 0.37.

Formulation and Coating Example 7

10 g of Polymer TiBTP liquid from Aldrich was poured into a bottle. 90 g of solvent PGMEA/PGME 70:30 was added immediately and mixed on a roller for 5-7 days to make a 10% stock solution. 1 g of polymer from synthesis example 2 and 9 g of PGMEA/PGME 70:30 were mixed to make a 10% polymer stock solution. 5 g of TiBTP stock solution was mixed with 5 g of polymer stock solution. 8 g of PGMEA/PGME 70:30 were added to above mixture. The solution was mixed on a roller for 1-2 days. The mixture then was filtered through a micro filter with a pore size of 0.2 um. The solution was then spun coated on a silicon wafer for 40 seconds. The coated wafer was then heated on a hot plate for 1 minute at 200° C. The underlayer coating was analyzed on a spectroscopic ellipsometer. The optimized refractive index "n" at 193 nm was 1.75 and the absorption parameter "k" was 0.30.

Formulation and Coating Example 8

10 g of Polymer TiBTP liquid from Aldrich was poured into a bottle. 90 g of solvent PGMEA/PGME 70:30 was added immediately and mixed on a roller for 5-7 days to make a 10% stock solution. 1 g of polymer from synthesis example 5 and 9 g of PGMEA/PGME 70:30 were mixed to make a 10% polymer stock solution. 5 g of TiBTP stock solution was mixed with 5 g of polymer stock solution. 8 g of PGMEA/PGME 70:30 was added to above mixture. The solution was mixed on a roller for 1-2 days. The mixture then was filtered through a micro filter with a pore size of 0.2 um. The solution was then spun coated on a silicon wafer for 40 seconds. The coated wafer was then heated on a hot plate for 1 minute at 200° C. The underlayer coating was analyzed on a spectroscopic ellipsometer. The optimized refractive index "n" at 193 nm was 1.75 and the absorption parameter "k" was 0.29.

Formulation and Coating Example 9

10 g of Polymer TiBTP liquid from Aldrich was poured into a bottle. 90 g of solvent PGMEA/PGME 70:30 and 1 g of acetylacetone was added immediately and mixed on a roller for 5-7 days to make a 10% stock solution. 1 g of polymer from synthesis example 7 and 9 g of PGMEA/PGME 70:30 were mixed to make a 10% polymer stock solution. 9.5 g of TiBTP stock solution was mixed with 0.5 g of polymer stock solution. 2.5 g of PGMEA/PGME 70:30 was added in above mixture. The solution was mixed on a roller for 1-2 days. The mixture then was filtered through a micro filter with a pore size of 0.2 um. The solution was then spun coated on a silicon wafer for 40 seconds. The coated wafer was then heated on a hot plate for 1 minute at 200° C.

Formulation and Coating Example 10

10 g of Polymer TiBTP liquid from Aldrich was poured into a bottle. 90 g of solvent PGMEA/PGME 70:30 was added immediately and mixed on a roller for 5-7 days to make a 10% stock solution. 1 g of polymer from synthesis example 6 and 9 g of PGMEA/PGME 70:30 were mixed to make a 10% polymer stock solution. 9.5 g of TiBTP stock solution was mixed with 0.5 g of polymer stock solution. 2.5 g of PGMEA/PGME containing 1% surfactant Bij30 (Aldrich) 70:30 was added in above mixture. The solution was mixed on a roller for 1-2 days. The mixture then was filtered through a micro filter with a pore size of 0.2 um. The solution was then spun coated on a silicon wafer for 40 seconds. The coated wafer was then heated on a hot plate for 1 minute at 200° C. The underlayer coating was analyzed on a spectroscopic ellipsometer. The optimized refractive index "n" at 193 nm was 1.65 and the absorption parameter "k" was 0.45.

Formulation and Coating Example 11

10 g of Polymer TiBTP liquid from Aldrich was poured into a bottle. 90 g of solvent PGMEA/PGME 70:30 was added immediately and mixed on a roller for 5-7 days to make a 10% stock solution. 1 g of polymer from comparative synthesis example 1 and 9 g of PGMEA/PGME 70:30 were mixed to make a 10% polymer stock solution. 9 g of TiBTP stock solution was mixed with 1 g of polymer stock solution. 8 g of PGMEA/PGME 70:30 and 0.4 g of GVL was added in above mixture. The solution was mixed on a roller for 1-2 days. The mixture then was filtered through a micro filter with a pore size of 0.2 um. The solution was then spun coated on a silicon wafer for 40 seconds. The coated wafer was then heated on a hot plate for 1 minute at 200° C. The underlayer coating was analyzed on a spectroscopic ellipsometer. The optimized reflective index "n" at 193 nm was 1.70 and the absorption parameter "k" was 0.55.

Formulation and Coating Example 12

10 g of Polymer TiBTP liquid from Aldrich was poured into a bottle. 90 g of solvent PGMEA/PGME 70:30 was added immediately and mixed on a roller for 5-7 days to make a 10% stock solution. 1 g of polymer from comparative synthesis example 1 and 9 g of PGMEA/PGME 70:30 were mixed to make a 10% polymer stock solution. 8.5 g of TiBTP stock solution was mixed with 1.5 g of polymer stock solution. 6 g of PGMEA/PGME 70:30 and 0.3 g of GVL was added in above mixture. The solution was mixed on a roller for 1-2 days. The mixture then was filtered through a micro filter with a pore size of 0.2 um. The solution was then spun coated on a silicon wafer for 40 seconds. The coated wafer was then heated on a hot plate for 1 minute at 200° C. The underlayer coating was analyzed on a spectroscopic ellipsometer. The optimized refractive index "n" at 193 nm was 1.76 and the absorption parameter "k" was 0.52.

Formulation and Coating Example 13

10 g of Polymer TiBTP liquid from Aldrich was poured into a bottle. 90 g of solvent PGMEA/PGME 70:30 was added immediately and mixed on a roller for 5-7 days to make a 10% stock solution. 1 g of polymer from comparative synthesis example 1 and 9 g of PGMEA/PGME 70:30 were mixed to make a 10% polymer stock solution. 5 g of TiBTP stock solution was mixed with 5 g of polymer stock solution. 10 g of PGMEA/PGME 70:30 was added in above mixture. The solution was mixed on a roller for 1-2 days. The mixture then was filtered through a micro filter with a pore size of 0.2 um. The solution was then spun coated on a silicon wafer for 40 seconds. The coated wafer was then heated on a hot plate for 1 minute at 200° C. The underlayer coating was analyzed on a spectroscopic ellipsometer. The optimized refractive index "n" at 193 nm was 1.81 and the absorption parameter "k" was 0.37.

Formulation and Coating Example 14

10 g of Polymer TiBTP liquid from Aldrich was poured into a bottle. 90 g of solvent PGMEA/PGME 70:30 was added immediately and mixed on a roller for 5-7 days to make a 10% stock solution. 1 g of polymer from comparative synthesis example 1 and 9 g of PGMEA/PGME 70:30 were mixed to make a 10% polymer stock solution. 3 g of TiBTP stock solution was mixed with 7 g of polymer stock solution. 12 g of PGMEA/PGME 70:30 was added in above mixture. The solution was mixed on a roller for 1-2 days. The mixture then was filtered through a micro filter with a pore size of 0.2 um. The solution was then spun coated on a silicon wafer for 40 seconds. The coated wafer was then heated on a hot plate for 1 minute at 200° C. The underlayer coating was analyzed on a spectroscopic ellipsometer. The optimized refractive index "n" at 193 nm was 1.84 and the absorption parameter "k" was 0.36.

Formulation and Coating Example 15

10 g of Polymer TiBTP liquid from Aldrich was poured into a bottle. 90 g of solvent PGMEA/PGME 70:30 was added immediately and mixed on a roller for 5-7 days to make a 10% stock solution. 1 g of polymer from synthesis example 9 and 9 g of PGMEA/PGME 70:30 were mixed to make a 10% polymer stock solution. 9.5 g of TiBTP stock solution was mixed with 0.5 g of polymer stock solution. 2.5 g of PGMEA/PGME 70:30 and 0.25 g of GVL was added in above mixture. The solution was mixed on a roller for 1-2 days. The mixture then was filtered through a micro filter with a pore size of 0.2 um. The solution was then spun coated on a silicon wafer for 40 seconds. The coated wafer was then heated on a hotplate for 1 minute at 200° C.

Formulation and Coating Example 16

1 g of polymer from synthesis example 6 and 9 g of PGMEA/PGME 70:30 were mixed to make a 10% polymer stock solution. 0.5 g of Tyzor® AA (75%) obtained from Aldrich Co. was mixed with 3.75 g of above polymer stock solution and 5 g of PGMEA/PGME 70:30. The solution was mixed on a roller for 24 hrs. The mixture then was filtered through a micro filter with a pore size of 0.2 um. The solution was then spun coated on a silicon wafer for 40 seconds. The coated wafer was then heated on a hot plate for 1 minute at 200° C.

Formulation and Coating Example 17

10 g of Polymer TiBTP liquid from Aldrich was poured into a bottle. 90 g of solvent 4-methyl-2-pentanol/1-pentanol 70:30 was added immediately and mixed on a roller for 3-5 days to make a 10% stock solution. 1 g of polymer from synthesis example 7 and 9 g of 4-methyl-2-pentanol/1-pentanol 70:30 was mixed to make a 10% polymer stock solution. 9.5 g of TiBTP stock solution was mixed with 0.5 g of polymer stock solution. 0.2 g of acetylacetone was added in above mixture. The solution was mixed on a roller for 3-5 days. The mixture then was filtered through a micro filter with a pore size of 0.2 um. The solution was then spun coated on a silicon wafer for 40 seconds. The coated wafer was then heated on a hot plate for 1 minute at 200° C.

Formulation and Coating Example 18

10 g of Polymer TiBTP liquid from Aldrich was poured into a bottle. 90 g of solvent PGMEA/PGME 70:30 was added immediately and mixed on a roller for 5-7 days to make a 10% stock solution. 1 g of polymer from synthesis example 6 and 9 g of PGMEA/PGME 70:30 were mixed to make a 10% polymer stock solution. 9.5 g of TiBTP stock solution was mixed with 0.5 g of polymer stock solution. 2.5 g of PGMEA/PGME containing 1% surfactant Bij30 (Aldrich) 70:30 was added in above mixture, 0.25 g of GVL and 0.1 g of acetylacetone was added in above mixture. The solution was diluted with 1.3 g of isopropanol and was mixed on a roller for 1-2 days. The mixture then was filtered through a micro filter with a pore size of 0.2 um. The solution was then spun coated on a silicon wafer for 40 seconds. The coated wafer was then heated on a hot plate for 1 minute at 200° C.

Formulation and Coating Example 19

9.5 g of Polymer TiBTP liquid from Aldrich was poured into a bottle. 90 g of solvent PGMEA/PGME 70:30, 2 g of GVL and 20 g of PGMEA/PGME 70:30 containing 1% surfactant Bij30 (Aldrich Co) was added immediately and mixed well. 0.5 g of polymer from synthesis example 6 and 4.5 g of PGMEA/PGME 70:30 were mixed to make a 10% polymer solution. The above solutions were mixed in a round bottle flask under nitrogen at 45 C for 24 h. After cooling down, 0.5 g acetylacetone was added with stirring. The solution was stored in a bottle and put on roller for 24 h. The mixture then was filtered through a micro filter with a pore size of 0.2 um. The solution was then spun coated on a silicon wafer for 40 seconds. The coated wafer was then heated on a hot plate for 1 minute at 200° C.

Example 20

Evaluation of Resistance to Solvents and Developer for BARC Films

PGMEA/PGME 70:30 solvent was dispensed on the silicon wafer coated with anitrogen blowing after 60 s. No significant film losses were observed. Similar experiments were performed with developer (AZ 300MIF, 2.38 weight % TMAH, available from AZ Electronics Material USA Corps, Somerville N.J.). The underlayer films from Coating Examples 1-11 and 14-19 demonstrated good resistance to developer. For coating examples 12 and 13, which was formulated by mixing TiBTP solution with polymer of comparative synthesis 1 example in different ratios, partial film loss was observed after immersion in developer for 60 s.

Example 21

Determination of Ti % in Cured Films

Ti % in the above metallic underlayer films were measured by elemental analysis and TGA weight loss measurement. The results from two methods were consistent. Depending on the TiBTP content in formulations, the measured Ti % ranged from 4-50% after 200° C./60 s film baking conditions.

Example 22

Formulation Stability Evaluations

The solutions of formulation examples 3-10 were subjected to long term shelf life stability test by coating the solution periodically every week. The formulation was spin coated on a silicon wafer and baked at 200° C./60 s. The coatings demonstrated good uniformity for at least one month. The coatings were also tested weekly for resistance to solvents and developer as in Example 20 and no change in performance was observed.

Lithographic Evaluation Example 1

The performance of the Ti metallic anti-reflective coating formulation was evaluated using AZ® 2110P photoresist (product of AZ Electronic Materials USA Corp., Somerville, N.J.). A silicon wafer was coated with Formulation and Coating Example 7 and baked at 200° C. for 60 seconds to form a 90 nm thick film. Then using AZ® EXP AX2110P photoresist a 190 nm film was coated on top and baked at 100° C. for 60 seconds. The wafer was then imaged using a 193 nm Nikon 306D exposure tool with a Numerical Aperture (NA) of 0.85, with Y-Dipole Illumination with a 0.85 outer sigma, and 0.55 inner sigma. The exposed wafer was then baked at 110° C. for 60 seconds and developed using AZ® 300MIF developer (TMAH) for 30 seconds. The top down and cross-section patterns when observed under scanning electron microscope showed no significant collapse in the process window. Good pattern profile has been observed at Line/Space 90 nm 1:1 with photospeed of 29 mJ/cm$^2$.

Lithography Evaluation Example 2

The performance of the Ti metallic anti-reflective coating formulation was evaluated using AZ® 2110P photoresist (product of AZ Electronic Materials USA Corp., Somerville, N.J.). A silicon wafer was coated with Formulation and Coating Example 3 and baked at 200° C. for 60 seconds to form a 38 nm thick film. Then using AZ® EXP AX2110P photoresist films targeting both 190 nm was coated on top and baked at 100° C. for 60 seconds. The wafers were then imaged using a 193 nm Nikon 306D exposure tool with a Numerical Aperture (NA) of 0.85, with Y-Dipole Illumination with an 0.85 outer sigma, and 0.55 inner sigma. The exposed wafers were then baked at 110° C. for 60 seconds and developed using AZ® 300MIF developer (TMAH) for 30 seconds. The top down patterns when observed under scanning electron microscope showed no significant collapse. Good pattern profile via cross-section scanning electron microscope has been observed at L/S 90 nm 1:1 with photospeed of 24.5 mJ/cm2.

The invention claimed is:

1. An underlayer composition comprising an organic titanate compound and a polymer, where the polymer comprises at least one fluoroalcohol group and at least one epoxy group.

2. The underlayer composition of claim 1, where the polymer comprises at least one unit with a fluoroalcohol group (1) and at least one unit with an epoxy group (2),

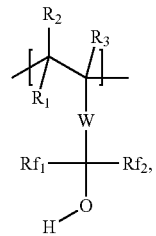

(1)

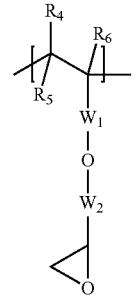

(2)

where, $R_1$ to $R_6$ are independently selected from hydrogen and $C_1$-$C_4$ alkyl, W is a linking group, $Rf_1$ and $Rf_2$ are independently selected from fluorinated ($C_1$-$C_6$) alkyl group and partially fluorinated ($C_1$-$C_6$) alkyl group; $W_1$ is selected from an arylene group, a carbonyl group having the structure (—(C=O)) and a carbonyloxyalkylene group having the structure (—C(=O)—O—$W_4$—) where $W_4$ is selected from a group consisting of $C_1$ to $C_6$ alkylene group, fluorinated ($C_1$-$C_6$) alkylene group and partially fluorinated ($C_1$-$C_6$) alkylene group; and, $W_2$ is a ($C_1$-$C_6$) alkylene group.

3. The underlayer composition of claim 2 where in the polymer the fluoroalcohol group (I) ranges between 10 and 80 mole % and the epoxy group (II) ranges between 20 and 90 mole %.

4. The underlayer composition according to claim 1 where the polymer further comprises unit of structure 3,

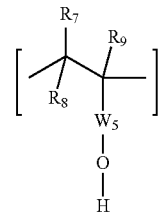

(3)

where $R_7$ to $R_9$ are independently selected from hydrogen and $C_1$-$C_4$ alkyl, $W_5$ is selected from a direct valance bond, an arylene group, an ester group having the structure (C(=O)—O—$R_{14}$), a $C_1$-$C_{20}$ alkylene group and mixtures thereof, and $R_{14}$ is selected from a group consisting of $C_1$-$C_{20}$ alkylene group, $C_1$-$C_{20}$ alkylenearylene group, arylene group and substituted arylene group.

5. The underlayer composition of claim 4 where the repeat unit (3) ranges between 1 and 40 mole % of the total repeat units.

6. The underlayer composition according to claim 1, where the polymer further comprises a recurring unit (4),

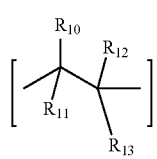

(4)

where, $R_{10}$ to $R_{12}$ are independently selected from hydrogen, nitrile and $C_1$-$C_4$ alkyl, $R_{13}$ is an aryl group or an ester group having the structure (—C(=O)—O—$R_{15}$), where $R_{15}$ is selected from a group consisting of a $C_1$-$C_{20}$ alkyl group, $C_1$-$C_{20}$ alkylenearyl group, aryl group, substituted aryl group, fluorinated alkyl group, partially fluorinated alkyl group and mixtures thereof.

7. The underlayer composition of claim 6, where the repeat unit (4) ranges between 1 and 30 mole % of total recurring units.

8. The underlayer composition of claim 1 where the organic titanate compound is selected from the group consisting of

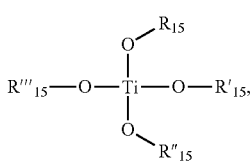

(5)

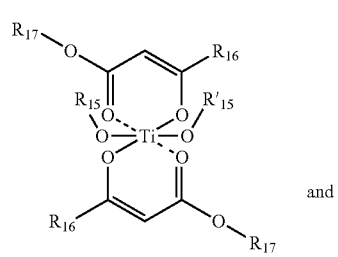

(6)

and

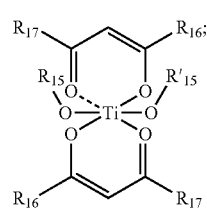

(7)

wherein $R_{15}$, $R'_{15}$, $R''_{15}$, and $R'''_{15}$ are independently selected from $C_1$-$C_{20}$ alkyl and $C_1$-$C_{20}$ alkyl carbonyl, and further wherein $R_{16}$ and $R_{17}$ are independently selected from $C_1$-$C_{20}$ alkyl and aryl group.

9. The underlayer composition of claim 8 where the amount of organic titanate (5), (6) and (7) in the composition ranges between 10 and 50 weight % of total solids.

10. The underlayer composition of claim 1 where the organic titanate is selected from the group consisting of

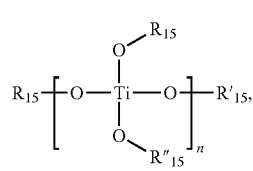

(8)

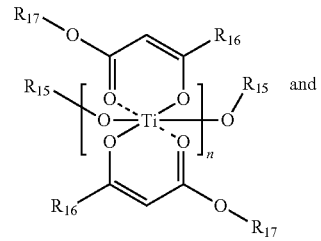

(9)

and

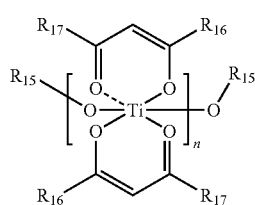

(10)

wherein n=2-10 and $R_{15}$, $R'_{15}$, and $R''_{15}$, are independently selected from the group consisting of $C_1$-$C_{20}$ alkyl and $C_1$-$C_{20}$ alkyl carbonyl, and further wherein $R_{16}$ and $R_{17}$ are independently selected from the group consisting of $C_1$-$C_{20}$ alkyl and aryl group.

11. The underlayer composition of claim 10 where the level of polymeric titanate compound (8) (9) and (10) in the underlayer composition ranges between 10 and 99.9 weight % of total solids.

12. The coated underlayer film cured between about 90° C. to about 300° C. from the composition of claim 1 having a refractive index (n) between 1.5 and 1.9 and an absorption (k) between 0.1 and 0.6 at 193 nm.

13. A process for manufacturing a microelectronic device, comprising;
a) providing a substrate with a underlayer film of claim 1;
b) curing the underlayer film by heating;
b) coating a photoresist layer above the underlayer coating layer;
c) imagewise exposing the photoresist layer to deep ultraviolet or extreme ultraviolet radiation;
d) developing the photoresist layer with an aqueous alkaline developing solution.

14. The process of claim 13, where the cured titanium underlayer film comprises titanium content ranging from 3 to 60 weight %.

15. The process of claim 13, where imagewise exposure is done with radiation whose wavelength ranges from 250 nm to 12 nm.

16. The process according to claim 13, where the developing solution is an aqueous solution comprising a hydroxide base.

17. The process according to claim 13, where the substrate optionally has one or more antireflective coatings coated over the substrate.

18. The process according to claim 13, where the substrate has at least one high carbon antireflective coating film coated over the substrate.

19. The process according to claim 13, further comprising dry etching the titanium underlayer film after step d).

20. The process according to claim 18, further comprising dry etching the titanium under layer film and the high carbon antireflective coating film separately after step d).

* * * * *